(12) United States Patent
Weitz et al.

(10) Patent No.: US 12,500,588 B2
(45) Date of Patent: Dec. 16, 2025

(54) LOGIC GATE DEVICE

(71) Applicant: FRIEDRICH-ALEXANDER-UNIVERSITÄT ERLANGEN-NÜRNBERG, Erlangen (DE)

(72) Inventors: Tobias Weitz, Erlangen (DE); Peter Hommelhoff, Erlangen (DE); Christian Heide, Weiden In Der Oberpfalz (DE)

(73) Assignee: FRIEDRICH-ALEXANDER-UNIVERSITÄT ERLANGEN-NÜRNBERG, Erlangen (DE)

( * ) Notice: Subject to any disclaimer, the term of this patent is extended or adjusted under 35 U.S.C. 154(b) by 521 days.

(21) Appl. No.: 17/993,207

(22) Filed: Nov. 23, 2022

(65) Prior Publication Data
US 2023/0170906 A1 Jun. 1, 2023

(30) Foreign Application Priority Data
Nov. 26, 2021 (EP) .................................... 21210695

(51) Int. Cl.
*H03K 19/0175* (2006.01)
*G02F 3/00* (2006.01)

(52) U.S. Cl.
CPC ....... *H03K 19/017536* (2013.01); *G02F 3/00* (2013.01)

(58) Field of Classification Search
CPC ........... H03K 19/017536; H03K 19/20; H03K 19/14; G02F 3/00
See application file for complete search history.

(56) References Cited

U.S. PATENT DOCUMENTS

| 4,689,793 A | 8/1987 | Liu et al. |
| 5,459,604 A | 10/1995 | Corkum et al. |

(Continued)

FOREIGN PATENT DOCUMENTS

EP 2839257 B1 8/2018

OTHER PUBLICATIONS

Agustin Schiffrin et al.: Optical-field-induced current in dielectrics, Nature, vol. 493, p. 70, Jan. 3, 2013.

(Continued)

*Primary Examiner* — Mariam Qureshi
(74) *Attorney, Agent, or Firm* — Harness, Dickey & Pierce, P.L.C.

(57) ABSTRACT

A logic gate device comprising a probe structure having an interface contact, a first logic input for receiving a first light pulse having a first carrier-envelope phase that encodes an input state of the first logic input and a second logic input for receiving a second light pulse having a second carrier-envelope phase that encodes an input state of the second logic input. The probe structure is arranged to be irradiated by the first light pulse to generate a first current component within the probe structure that depends on the first carrier-envelope phase and to be irradiated by the second light pulse to generate a second current component within the probe structure that depends on the second carrier-envelope phase. The interface contact is arranged to output a sum current that comprises the first and second current component, wherein the sum current encodes a logic output state of a logic output.

17 Claims, 10 Drawing Sheets

(56) References Cited

U.S. PATENT DOCUMENTS

Figure 1:
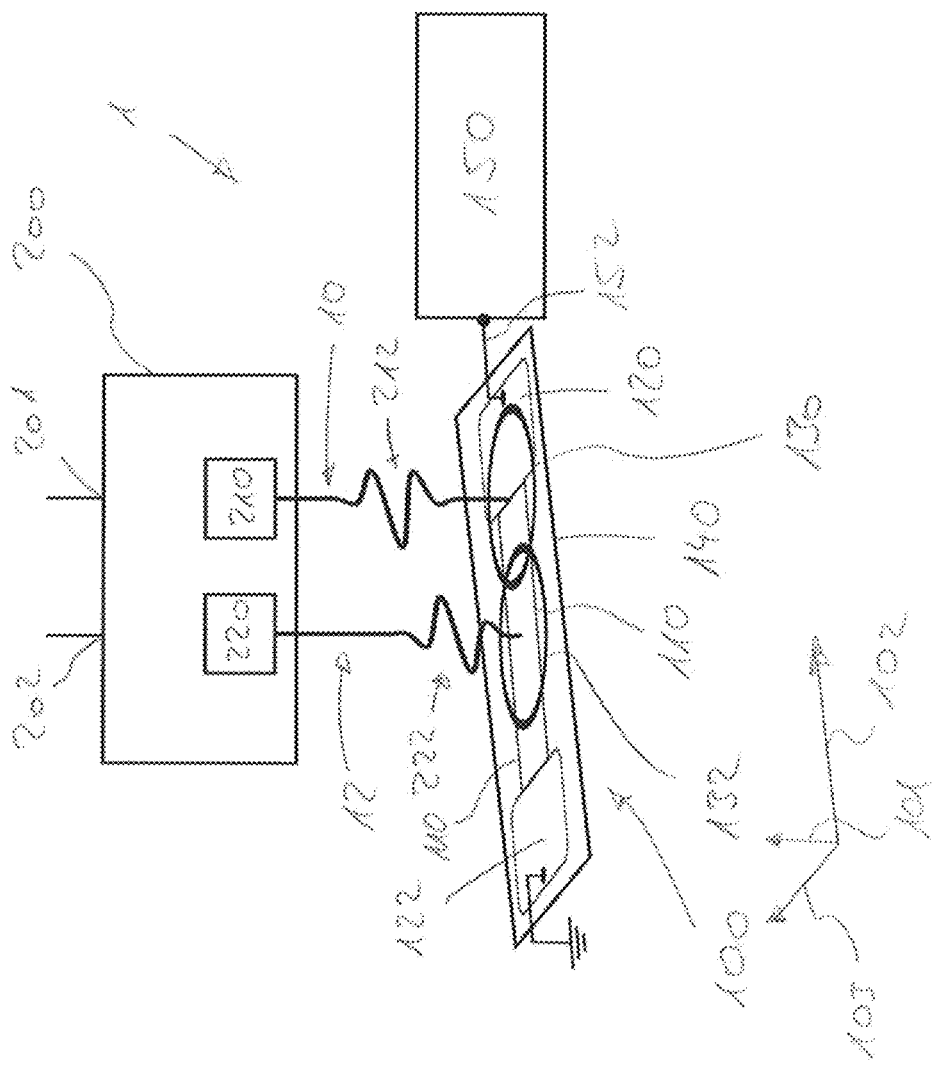

| | | | | |
|---|---|---|---|---|
| 2004/0004780 | A1* | 1/2004 | Watanabe | G02F 1/3515 |
| | | | | 359/891 |
| 2010/0219858 | A1* | 9/2010 | Ditto | H03K 19/20 |
| | | | | 326/37 |
| 2020/0006693 | A1 | 1/2020 | Lauermann et al. | |
| 2020/0066932 | A1* | 2/2020 | Lauermann | H10F 55/25 |

OTHER PUBLICATIONS

Antonio J. Garzón-Ramirez et al.: Symmetry breaking in the Stark Control of Electrons at Interfaces (SCELI), The Journal of Chemical Physics 153, p. 044704 (2020).
Bai, Y. et al. High-harmonic generation from topological surface states. Nat. Phys. 17, 311-315 (2021).
Boolakee, T. et al. Length-dependence of light-induced currents in graphene. J. Phys. B 53, 154001 (2020).
Brida, D. et al. Ultrafast collinear scattering and carrier multiplication in graphene. Nat. Commun. 4, 1987 (2013).
Chen, L., Zhang, Y., Chen, G. & Franco, I. Stark control of electrons along nanojunctions. Nat. Commun. 9, 2070 (2018).
Christian Heide et al.: Attosecond-fast internal photoemission, Nature Photonics, vol. 14, p. 219, Apr. 2020, 219-222.
Ferenc Krausz et al.: Attosecond metrology: from electron capture to future signal processing, Nature Photonics, vol. 8, p. 205, Mar. 2014.
Fortier, T. M. et al. Carrier-envelope phase-controlled quantum interference of injected photocurrents in semiconductors. Phys. Rev. Lett. 92, 147403 (2004).
Franco, I. & Brumer, P. Minimum requirements for laser-induced symmetry breaking in quantum and classical mechanics. J. Phys. B 41, 074003 (2008).
Gabor, N. M. et al. Hot carrier-assisted intrinsic photoresponse in graphene. Science 334, 648-652 (2011).
Garg, M. et al. Multi-petahertz electronic metrology. Nature 538, 359-363 (2016).
Gierz, I. et al. Snapshots of non-equilibrium Dirac carrier distributions in graphene. Nat. Mater. 12, 1119-1124 (2013).
Hanus, V. et al. Light-field-driven current control in solids with pJ-level laser pulses at 80?MHz repetition rate. Optica 8, 570 (2021).
Heide, C. et al. Electronic coherence and coherent dephasing in the optical control of electrons in graphene. Nano Lett. 21, 9403-9409 (2021).
Jiménez-Galán, A., Silva, R. E. F., Smirnova, O. & Ivanov, M. Lightwave control of topological properties in 2D materials for sub-cycle and non-resonant valley manipulation. Nat. Photon. 14, 728-732 (2020).
Jürgens, P. et al. Origin of strong-field-induced low-order harmonic generation in amorphous quartz. Nat. Phys. 16, 1035-1039 (2020).
Kelardeh, H. K., Apalkov, V. & Stockman, M. I. Graphene in ultrafast and superstrong laser fields. Phys. Rev. B 91, 045439 (2015).
Langer, F. et al. Few-cycle lightwave-driven currents in a semiconductor at high repetition rate. Optica 7, 276 (2020).
Lucchini, M. et al. Attosecond dynamical Franz-Keldysh effect in polycrystalline diamond. Science 353, 916-919 (2016).
Lui, C. H., Mak, K. F., Shan, J. & Heinz, T. F. Ultrafast photoluminescence from graphene. Phys. Rev. Lett. 105, 127404 (2010).
Ma, Q. et al. Direct optical detection of Weyl fermion chirality in a topological semim et al. Nat. Phys. 13, 842-847 (2017).
Malic, E., Winzer, T., Bobkin, E. & Knorr, A. Microscopic theory of absorption and ultrafast many-particle kinetics in graphene. Phys. Rev. B 84, 205406 (2011).
Mueller, T., Xia, F., Freitag, M., Tsang, J. & Avouris, Ph. Role of contacts in graphene transistors: a scanning photocurrent study. Phys. Rev. B 79, 245430 (2009).
Neufeld, O., Tancogne-Dejean, N., de Giovannini, U., Hubener, H. & Rubio, A. Light-driven extremely nonlinear bulk photogalvanic currents. Phys. Rev. Lett. 127, 126601 (2021).
Sanari, Y. et al. Role of virtual band population for high harmonic generation in solids. Phys. Rev. B 102, 041125 (2020).
Schlaepfer, F. et al. Attosecond optical-field-enhanced carrier injection into the GaAs conduction band. Nat. Phys. 14, 560-564 (2018).
Schultze, M. et al. Controlling dielectrics with the electric field of light. Nature 493, 75-78 (2012).
Shautsova, V. et al. Plasmon induced thermoelectric effect in graphene. Nat. Commun. 9, 5190 (2018).
Sommer, A. et al. Attosecond nonlinear polarization and light-matter energy transfer in solids. Nature 534, 86-90 (2016).
Song, J. C. W., Tielrooij, K. J., Koppens, F. H. L. & Levitov, L. S. Photoexcited carrier dynamics and impact-excitation cascade in graphene. Phys. Rev. B 87, 155429 (2013).
Takuya Higuchi et al.: Light-field-driven currents in graphene, Nature, vol. 550, p. 224, Oct. 12, 2017.
Tan, S. et al. Coherent electron transfer at the Ag/graphite heterojunction interface. Phys. Rev. Lett. 120, 126801 (2018).
Tetienne, J. P. et al. Quantum imaging of current flow in graphene. Sci. Adv. 3, e1602429 (2017).
Woessner, A. et al. Near-field photocurrent nanoscopy on bare and encapsulated graphene. Nat. Commun. 7, 10783 (2016).
Yablonovitch, E., Heritage, J. P., Aspnes, D. E. & Yafet, Y. Virtual photoconductivity. Phys. Rev. Lett. 63, 976-979 (1989).
Yamanishi, M. Field-induced optical nonlinearity due to virtual transitions in semiconductor quantum well structures. Phys. Rev. Lett. 59, 1014-1017 (1987).
F10715PEP Search Report dated May 17, 2022.

* cited by examiner

Fig. 7

| φB | φA | B | A | Y=A⊼B |
|---|---|---|---|---|
| +π/2 | +π/2 | 0 | 0 | ↑ / ○ (1) |
| +π/2 | 0 | 0 | 1 | ○ / ↑ (0) |
| 0 | +π/2 | 1 | 0 | ↑ / ○ (0) |
| 0 | 0 | 1 | 1 | ○ / ○ (0) |

Fig. 8

| φB | φA | B | A | Y=A∧B |
|---|---|---|---|---|
| -π/2 | -π/2 | 0 | 0 | ↓ / ↓ (0) |
| -π/2 | +π/2 | 0 | 1 | ↑ / ↓ (0) |
| +π/2 | -π/2 | 1 | 0 | ↓ / ↑ (0) |
| +π/2 | +π/2 | 1 | 1 | ↑ / ↑ (1) |

Fig. 9

| φB | φA | B | A | Y=A∨B |
|---|---|---|---|---|
| +π/2 | +π/2 | 0 | 0 | ↑ / ○ (1) |
| +π/2 | 0 | 0 | 1 | ○ / ↓ (0) |
| -π/2 | +π/2 | 1 | 0 | ↑ / ○ (0) |
| -π/2 | 0 | 1 | 1 | ○ / ↓ (0) |

Fig. 10

| φB | φA | B | A | Y=A∨B |
|---|---|---|---|---|
| 0 | +π/2 | 0 | 0 | ○ / ○ (0) |
| 0 | 0 | 0 | 1 | ○ / ↑ (1) |
| +π/2 | +π/2 | 1 | 0 | ↑ / ○ (1) |
| +π/2 | 0 | 1 | 1 | ↑ / ↑ (1) |

LOGIC GATE DEVICE

The project leading to the present disclosure has received funding from the European Union's Horizon 2020 research and innovation programme under grant agreements No 829153 (FET Open project PETACom) and No 884217 (ERC Adv. Grant AccelOnChip). This work has been further supported in part by the Deutsche Forschungsgemeinschaft (SFB 953 271 "Synthetic Carbon Allotropes"), and ERC Grant NearFieldAtto.

The present disclosure relates to a logic gate device and a method for implementing a logic gate.

In general, a logic gate performs a Boolean function and generates a binary output from one or more binary inputs. Typical logic gates having two inputs are the AND, NAND, OR and NOR gate. Thereby, the NOR gate as well as the NAND gate each constitute a universal logic gate that can reproduce the function of all other gates when being suitably combined.

Typical logic gates are physically implemented by electronic structures based on semiconductor devices, such as transistors or diodes. The logic states of such logic gates are encoded in voltage or current values occurring at the inputs and outputs of the electronic structures. Purely electronic logic gates exhibit a fundamental speed limit that is governed by the propagation dynamics of the voltages and currents used to encode the logic states within the circuitry. This ultimately poses a limit to the speed with which algorithms may be executed.

Accordingly, there is a need for implementations of logic gates that allow for speed improvement over classical electronic implementations.

The present disclosure provides a logic gate device and a method for implementing a logic gate according to the independent claims. Embodiments are given in the dependent claims, the description, and the drawings.

In one aspect, the present disclosure is directed at a logic gate device comprising a probe structure having an interface contact, a first logic input for receiving a first light pulse having a first carrier-envelope phase that encodes an input state of the first logic input and a second logic input for receiving a second light pulse having a second carrier-envelope phase that encodes an input state of the second logic input. Thereby, the probe structure is arranged to be irradiated by the first light pulse in a first interaction region to generate a first current component within the probe structure that depends on the first carrier-envelope phase, and the probe structure is arranged to be irradiated by the second light pulse in a second interaction region to generate a second current component within the probe structure that depends on the second carrier-envelope phase. The interface contact is arranged to output a sum current that comprises the first and second current component, wherein the sum current encodes a logic output state of a logic output of the logic gate device.

By using logic input states that are encoded in the carrier-envelope phase of two light pulses, the logic gate device according to the present disclosure is able to receive information that may change on the timescale of the period of the electric field of the light pulses. Furthermore, since the currents within the probe structure are determined by the carrier-envelope phase of the light pulses, they are also manipulated on the timescale of the electric field period of the light pulses. The logic gate device according to the present disclosure thus provides a logic gate in which electric currents and thus also information may be ultimately processed at the frequency of the electric field of the input light pulses, which frequency lies in the range above 100 THz, way above the typical clock frequencies of up to 10 GHz of conventional electronic devices.

Furthermore, the logic gate device according to the present disclosure allows for simultaneous conversion of information encoded in the carrier-envelope phases of the light pulses into electric currents and execution of a gate operation. This provides a further speed up compared to conventional electronic devices.

In general, the present disclosure is thus based on the insight that a logic gate device may be realized by exploiting ultrafast strong-field manipulation of charge carriers within the probe structure, which may be configured as a solid-state structure. The first and/or second current component may thereby be generated by a virtual charge carrier population within the probe structure, whereby the population of virtual charge carriers vanishes after passage of the respective light pulse, or by a real charge carrier population within the probe structure, wherein the population of real charge carriers persists after passage of the light pulse.

The probe structure may comprise or be configured as a photoactive material. For example, the probe structure may be configured as a photoconductor. The photoconductor may have a free charge carrier mobility that allows for transport of optically excited charge carriers. The probe structure may comprise or consist of a material having a band gap between a valence band and a conduction band, such as a dielectric, a semiconductor, a semimetal or a metal. The band gap may be larger than a photon energy of the first and/or second light pulse, for example at least two times, or at least three times the photon energy of the first and/or second light pulse. The band gap additionally or alternatively may be at most two times, at most three times or at most four times the photon energy of the first and/or second light pulse.

The probe structure may comprise or consist of an atomically thin material that has less than ten, for example less than five, less than three or less than two atomic layers, such as one atomic layer in a height direction. The probe structure may be provided on an insulating and/or transparent support layer, such as a dielectric or a semiconductor. The support layer may have a band gap that is larger than a bandgap of the photoactive material or photoconductor, for example at least double or at least three times larger than the bandgap of the photoactive material or photoconductor.

The carrier-envelope phases of the first and second light pulse generally refer to an offset between a peak of the electric field of the carrier wave of the respective light pulse relative to a peak of the pulse envelope of the respective light pulse. For a carrier-envelope phase of 0 rad or $\pi$ rad, a peak of the electric field of the carrier wave coincides with the peak of the pulse envelope. The values of 0 rad and $\pi$ rad are then assumed for the electric field pointing in opposite directions with equal amplitudes at the peak of the pulse envelope. For a carrier-envelope phase of $\pm\pi/2$ rad, a zero crossing of the electric field of the carrier wave coincides with the peak of the pulse envelope. The values of $+\pi/2$ rad and $-\pi/2$ rad are then assumed for the electric field pointing in opposite directions before and after crossing zero at the peak of the pulse envelope.

The first light pulses received via the first logic input may encode binary input states that may assume two distinctive states, a logical 0 and a logical 1. Likewise, the second light pulses received via the second logic input may also encode binary input states.

In general, an individual input state of the first or second logic input may be encoded as a carrier-envelope phase value that is selected from a phase value group containing a carrier-envelope phase value that generates the respective first or second current component as a current flowing in a specific direction within the probe structure, a carrier-envelope phase value that generates the respective first or second current component as a current flowing in a direction opposite to the specific direction within in the probe structure, and a carrier-envelope phase value that generates the respective first or second current component as no net current flowing inside the probe structure, that is, as a current component corresponding to zero current. These types of currents are easily discernable from each other. Said specific direction may, for example, be a direction towards the interface contact of the probe structure or away from the interface contact. The specific direction may be a direction from a further interface contact towards the interface contact or a direction away from the interface contact towards the further interface contact.

For a binary logic, the two different input states of one or both of the first and second logic inputs may be encoded in respective distinct carrier-envelope phase values that are chosen from said phase value group. For example, a first input state of one or of both of the first and second logic inputs may be encoded as a carrier-envelope phase value that generates the respective current component flowing in the specific direction and a second input state of the one or of both of the first and second logic inputs may be encoded as a carrier-envelope phase value that generates the respective current component flowing opposite to the specific direction. Alternatively, the second input state of the one or of both of the first and second logic inputs may be encoded as a carrier-envelope phase value that generates the respective current component as zero current. As another alternative, for one of the first and second logic inputs the first input state is encoded as a carrier-envelope phase value that generates the respective current component flowing in the specific direction and the second input state is encoded as a carrier-envelope phase value that generates the respective current component flowing opposite to the specific direction, while, for the other one of the first and second logic inputs the first input state is encoded as a carrier-envelope phase value that generates the respective current component flowing in the specific direction and the second input state is encoded as a carrier-envelope phase value that generates the respective current component as zero current.

The first and/or second carrier-envelope phases may be chosen from a group comprising or consisting of $-\pi/2$ rad, $+\pi/2$ rad, 0 rad, $\pi$ rad or from a group consisting of $-\pi/2$ rad, $+\pi/2$ rad and 0 rad or from a group consisting of $-\pi/2$ rad and $+\pi/2$ rad or from a group consisting of 0 rad and $\pi$ rad. Light pulses exhibiting these carrier-envelope phases are configured to excite distinct and well-discernible current components within the probe structure.

The first and/or the second light pulse may be few-cycle light pulses. They may comprise less than twenty, such as less than fifteen, less than ten, less than eight, less than five, or less than two full cycles of the electric field of the carrier wave, such as at most one full cycle of the electric field of the carrier wave within one pulse envelope or within one full-width-half-maximum (FWHM) pulse duration of the light pulses.

The first and/or second light pulse may have a FWHM pulse duration below 20 fs, such as below 10 fs or below 7 fs, such as at most 6 fs. For example, the FWHM pulse duration may amount to 6 fs.

A central photon energy of the first and/or second light pulse may amount to at least 0.5 eV, such as at least 1.0 eV or at least 1.25 eV. Furthermore, the central photon energy may be at most 3.0 eV, such as at most 2.0 eV or at most 1.75 eV. For example, the central photon energy of the first and/or second light pulses may be 1.5 eV.

A peak electric field strength of the first and/or second light pulses on the surface of the probe structure may be at least 1 V/nm, such as 1.5 V/nm, 1.8 V/nm or 2 V/nm. Additionally or alternatively, the peak electric field strength of the first and/or second light pulses on the surface of the probe structure may be at most 5 V/nm, at most 3 V/nm or at most 2.5 V/nm. For example, the peak electric field strength of the first and/or second light pulses on the surface of the probe structure may be between 2 V/nm and 3 V/nm, for example for a probe structure configured as graphene. The peak electric field strength of the first and/or second light pulses on the surface of the probe structure may be, for example, 2.2 V/nm. The peak electric field strength on the surface of the probe structure may be smaller than the peak electric field strength in free space due to dielectric polarization response of parts of the probe structure, such as a dielectric substrate.

The electric fields of the first and/or second light pulses may have a non-vanishing electric field component parallel to the probe structure. For example, the electric fields may be orientated perpendicular to a height direction of the probe structure. Additionally or alternatively, the electric fields may be orientated parallel to a connection line between the interface contact and a further interface contact.

The interface contacts may be configured as metallic contacts, such as gold contacts, or as p-n junctions or Schottky junctions. The interface contacts may be connected to an electronic circuit of a measurement device that is configured to measure the first and second current component and/or the sum current.

The first and second current component may be transient currents that would vanish after passage of the light pulses if not being probed transiently. They may thereby have the same transient rise time and/or lifetime or different transient rise times and/or lifetimes. The lifetimes thereby may denote respective durations of the first and second current component.

The first and second light pulse may irradiate the probe structure with a relative time delay. Such a time delay may be adapted to synchronize the generation of the first and second current component in a way that the first and second current components at least partly overlap at the interface contact, which may be used to measure the current components and/or the sum current. This allows determining the sum current by measuring the total current within the probe structure. The time delay may be unequal to zero, for example with embodiments in which the first and second current component exhibit different transient rise times. The time delay may also amount to zero, for example in embodiments in which the first and second current component exhibit the same transient rise time.

The first and/or second logic inputs may be configured as free space inputs that receive the first and/or second light pulse while the light pulses are propagating unguided through free space. The first and/or second logic input may also be configured as light guiding ports that interface the probe structure from a light guiding structure, such as an optical waveguide, a fiber, a photonic structure, a plasmonic structure, or the like. The first and/or second light pulses may be coupled to the probe structure from far field light sources, whereby the probe structure is placed in the far field of the corresponding light sources, or they may be coupled to the probe structure from near field light sources, whereby the probe structure is placed in the near field of the corresponding light sources.

The logic gate device may be connected to a measurement device that is configured to determine the sum current by measuring the sum current, for example at the interface contact between the probe structure and an electric circuit of the measurement device. The sum current may be, for example, a current that flows from the probe structure into the interface contact or it may be a current that flows out of the interface contact into the probe structure. The measurement device may be configured to directly measure the sum current without determining the individual first and second current components.

The measurement device may be further configured to derive an output state of the logic output from the sum current comprising the first and second current component. For deriving the output state, the measurement device may be configured to compare the sum current to a predetermined threshold. A first output state may then be derived if the sum current exceeds the predetermined threshold and a second output state may be derived if the sum current equals at most the predetermined threshold.

The measurement device may be configured to determine a current value of the sum current as a signed current value having a magnitude and one of a positive and negative direction. The positive direction may, for example, be from the probe structure into the interface contact and the negative direction may be out of the interface contact into the probe structure.

The first and/or second interaction regions may correspond to the areas of the probe structure that is irradiated by the respective first and/or second light pulse. A transverse size of the first and/or second interaction regions may be smaller than a transverse extent of the probe structure, the transverse extent and size corresponding, for example, to the extent and size in a transverse direction connecting the interface contacts of the probe structure. The transverse size, the transverse extent and the transverse direction may also be a longitudinal size, longitudinal extent or longitudinal direction, respectively. The transverse direction may, for example, also be a direction of a shortest distance between the first interface contact and the second interface contact. For example, the transverse size of the first and/or second interaction regions may be smaller than 0.9 times, such as smaller than 0.8 times or smaller than 0.75 times said transverse extent of the probe structure. A size of the interaction region may, for example, amount to a transverse diameter, such as twice a $1/e^2$ intensity radius, of the respective light pulse at the probe structure.

Exemplarily, the transverse extent of the probe structure may be larger than 2.5 µm, larger than 3 µm or larger than 4 µm. Additionally or alternatively, the transverse extent may be smaller than 10 µm, smaller than 8 µm or smaller than 6 µm. The transverse extent may, for example, amount to 5 µm. The transverse size of the first and/or second interaction region may be larger than 2 µm, larger than 3 µm or larger than 3.5 µm. Additionally or alternatively, the transverse size may be smaller than 7 µm, smaller than 5 µm or smaller than 4 µm. The transverse extent may, for example, amount to 3.6 µm.

At least the first or the second interaction region may be placed in an area of the probe structure in which a translational symmetry of the probe structure is broken, for example, in an area in which a translational symmetry along a direction that has at least a component parallel to the electric field of the light pulses is broken. Said direction may be parallel to the electric field of the light pulses.

A logic gate that is implemented by the logic gate device may be one of an AND gate, an OR gate, a NOR gate and a NAND gate. The logic gate may be a universal or functionally complete logic gate, such as one of the NOR gate and the NAND gate.

According to an embodiment, the input state of the first logic input is encoded in a phase value of the first carrier-envelope phase that causes the first light pulse to generate the first current component due to a net polarization of virtual charge carriers within the probe structure. Since the net polarization of virtual charge carriers builds up on a timescale comparable to the duration of the driving light pulse, the first current component may be generated on short timescales thus enabling first gate dynamics. According to the present disclosure, a net polarization or a net momentum is a polarization or momentum that does not average to zero after passage of the light pulse.

In general, the term virtual charge carriers denotes charge carriers, such as electrons, that are transiently excited during the duration of the light pulse only. Thereby, they do not acquire a net momentum that would allow them to travel through the probe structure after passage of the light pulse. The excitation of virtual charge carriers is therefore generally not observable after passage of the light pulse.

The probe structure may have a symmetry breaking structure within the first interaction region that is configured to probe the polarization of the virtual charge carriers that is generated by the light pulse. The symmetry breaking structure may be configured to capture a specific part of the virtual charge carriers to generate the first current component. This specific part may, for example, be a subset of the charge carriers that are driven towards the symmetry breaking structure. The symmetry breaking structure may be a conducting structure, such as a metallic structure, a p-n junction or a Schottky junction. The symmetry breaking structure may, for example, be one of the interface contacts that connect the probe structure with the measurement device. The first interaction region may at least partly overlap with a boundary region around one of these interface contacts.

To generate the net polarization of virtual charge carriers the input state of the first logic input may be encoded in a first carrier-envelope phase that amounts to 0 rad or π rad. For such a carrier-envelope phase, the electric field of the light pulse has time-inversion symmetry with respect to the peak value of the envelope of the light pulse. This leads to the average electric field strength being larger in one direction along the polarization axis than in the opposite direction, therefore imparting a non-vanishing polarization on the excited charge carriers during passage of the pulse.

With this embodiment, a first input state of the first logic input may be encoded as a first carrier-envelope phase that equals to one of 0 rad and π rad and a second input state of the first logic input may be encoded as a first carrier-envelope phase that equals to the other one of 0 rad and π rad. Alternatively, the second input state of the first logic input may also be encoded as a carrier-envelope phase that generates the first current component as a zero current, such as a carrier-envelope phase of +π/2 rad or −π/2 rad.

According to an embodiment, the input state of the second logic input is encoded in a phase value of the second carrier-envelope phase that causes the second light pulse to generate the second current component due to a net momentum of real charge carriers within the probe structure. These real charge carriers may form a persistent second current component that remains even after the second light pulse has passed through the probe structure. This facilitates readout of the second current component. Furthermore, a persistent second current component allows to perform multiple gate operations that use the input state of the second logic input for various input states of the first logic input.

In general, the term real charge carriers denotes charge carriers, such as electrons, that are irreversibly excited during the passage of the light pulse. Such real charge carriers may acquire a net momentum during interaction with the light pulse and may thus travel through the probe structure even after the passage of the light pulse. A current component, such as the second current component, that is generated by the excitation of real charge carriers may build up after the light pulse has passed the probe structure.

With this embodiment, the second interaction region may be placed in an area of the probe structure that is separate from a symmetry breaking structure, for example an interface contact. Thereby, the second interaction region may be separate from said boundary regions around the interface contacts. In general, the second interaction region may be placed in a bulk region of the probe structure.

To generate real charge carriers with a net momentum within the probe structure, the input state of the second logic input may be encoded in a carrier-envelope phase that amounts to $+\pi/2$ rad or $-\pi/2$ rad. For such carrier-envelope phases, the electric field of the light pulse is temporally antisymmetric with respect to the peak value of the envelope of the light pulse, while the vector potential has time-inversion symmetry with respect to the peak value. The symmetric vector potential leads to the average vector potential over the entire pulse being larger in one direction along the polarization axis than in the opposite direction, therefore imparting a non-vanishing momentum on the excited charge carriers during passage of the pulse.

With this embodiment, a first input state of the second logic input may be encoded as a first carrier-envelope phase that equals one of $-\pi/2$ rad and $+\pi/2$ rad and a second input state of the first logic input may be encoded as a second carrier-envelope phase that equals the other one of $-\pi/2$ rad and $+\pi/2$ rad. Alternatively, the second input state of the second logic input may also be encoded as a carrier-envelope phase that generates the second current component as a zero current, such as a carrier-envelope phase of 0 rad or $\pi$ rad.

According to one embodiment of the logic gate device according to the present disclosure, the input state of the first logic input is encoded in a phase value of the first carrier-envelope phase that causes the first light pulse to generate the first current component due to a net polarization of virtual charge carriers within the probe structure and the input state of the second logic input is encoded in a phase value of the second carrier-envelope phase that causes the second light pulse to generate the second current component due to a net momentum of real charge carriers within the probe structure. In addition to the technical effect mentioned above, this embodiment provides a much larger design space for implementing the logic gate device than embodiments that use one charge carrier type only.

According to another embodiment, the input state of the second logic input is encoded in a phase value of the second carrier-envelope phase that causes the second light pulse to generate the second current component due to a net polarization within the probe structure. Like with the input state of the first logic input, such encoding of the input state of the second logic input allows to exploit the short rise times associated with polarization buildup of virtual charge carriers for realizing fast gate dynamics.

In one embodiment, both the input states of the first logic input and the input states of the second logic input may be encoded in phase values of the respective carrier-envelope phases that cause both the first and second light pulses to generate the respective current component due to a net polarization of virtual charge carriers within the probe structure. This provides an overall fast gate dynamic.

In another embodiment, both the input states of the first logic input and the input states of the second logic input may be encoded in phase values of the respective carrier-envelope phases that cause both the first and second light pulse to generate the respective current component due to a net momentum of real charge carriers within the probe structure.

In general, the first and second interaction region may overlap or be identical.

According to an embodiment, the first interaction region is at least partly, such as fully, separate from the second interaction region. This allows to disentangle the generation of the first current component from the generation of the second current component. For example, said separation aids to base the generation of the first current component on a first physical principle, for example the excitation of virtual charge carriers, and the generation of the second current component on a different second physical principle, such as said excitation of real charge carriers. Furthermore, a possible optical interference between the first light pulse and the second light pulse may be avoided.

For example, in cases, in which the first current component is generated by excitation of virtual charge carriers and the second current component is generated by excitation of real charge carriers, the first interaction region may be placed at said symmetry breaking structure and the at least partly separated second interaction region may be placed separated from the symmetry breaking structure. In cases, in which both the first and second current components are generated by excitation of virtual charge carriers, the first interaction region may comprise a first symmetry breaking structure and the second interaction region may comprise a second symmetry breaking structure. For example, the first interaction region may overlap with a first boundary region around a first interface contact for symmetry breaking and the second interaction region may overlap with a second boundary region around a second interface contact, which is separate from the first interface contact.

For example, a center of the first interaction region may be separated from a center of the second interaction region by more than 0.4 times, more than 0.5 times, or more than 0.6 times the transverse or longitudinal size of the first and/or second interaction region. A separation between the centers of the first and second interaction region may amount to more than 0.2 times, more than 0.3 times, or more than 0.4 times the transverse or longitudinal extent of the probe structure. Additionally or alternatively, said separation may be less than, for example, less than 0.8 times, or less than 0.6 times the transverse or longitudinal extent of the interaction structure. The center of the first interaction region may be separated from the center of the second interaction region by more than 1 µm, more than 2 µm, for example by 2.5 µm.

According to an embodiment, the first interaction region encompasses a boundary region between the probe structure and the interface contact. Such placement of the first interaction region provides a symmetry breaking structure that allows to capture a net polarization of virtual charge carriers within the first interaction region.

According to an embodiment, the second interaction region is separate from a boundary region between the probe structure and the interface contact. Such placement of the second interaction region allows the generation of real charge carriers having a net momentum after passage of the second light pulse.

According to an embodiment, the first current component is generated having a first lifetime or first duration that is smaller than a second lifetime or second duration of the second current component, and the probe structure is arranged to be irradiated with at least one additional first light pulse received via the first logic input during the second lifetime or second duration, wherein the additional first light pulse generates an additional first current component within the probe structure. The interface contact is arranged to output an additional sum current that comprises the additional first current component and the second current component, wherein the additional sum current encodes an additional logic output state of the logic output of the logic gate device.

Using a single second current component for performing several gate operations with various input states of the first logic input reduces the energy consumption of the logic gate device compared to gate operations that require the generation of several second current components. A logic gate device that implements such multiple use of a single second current component is furthermore suited to efficiently execute algorithms that have been optimized by grouping logic operations that use the same input state for the second logic input in consecutive gate operations.

A persistent second current component having a larger second lifetime or second duration than the first current component may, for example, be generated by exciting virtual charge carriers with the first light pulse and by exciting real charge carriers with the second light pulse.

Said measurement device for measuring the sum current may also be configured to measure the additional sum current at the interface contact of the probe structure. Furthermore, the measurement device may be configured to derive the additional output state of the logic output from the additional sum current. The measurement device may then output the additional output state via the logic output.

According to an embodiment, the probe structure has a smaller extent in a height direction than in a transverse or longitudinal direction, the height direction being orientated perpendicular to the transverse or longitudinal direction. The interface contact thereby is positioned at a lateral side of the probe structure, the lateral side limiting the probe structure in the transverse or longitudinal direction. Such a placement of the interface contact exposes the probe structure in the height direction and facilitates the irradiation of the probe structure with the first and/or second light pulse. For example, the first and/or second light pulses may be irradiated essentially parallel to the height direction onto the probe structure.

The probe structure may have a smaller extent in the height direction than in the transverse direction and an additional transverse direction, the additional transverse direction being orientated perpendicular to the height direction and the transverse direction.

According to an embodiment, the first interaction region and the second interaction region are located next to each other in the transverse direction. This allows for efficient summation of the first and second current component to generate the sum current. The transverse direction may be parallel to the polarization direction, that is the direction of the electric field, of the first and/or second light pulse.

According to an embodiment, the probe structure comprises a material having a conduction and a valence band. Such a material allows for the excitation of charge carriers from the valence band to the conduction band, for example by the first and/or second light pulse, and thus for providing charge carriers for generating the first and/or second current component. Charge carrier generation may, for example, be caused by multi-photon absorption of the first and/or second light pulse or by interband tunneling between the valence band and the conduction band.

The probe structure may be, for example, a graphene structure. This provides a conducting probe structure that has a broadband optical response and avoids temporal or spectral deformation of the light pulses in their passage through the probe structure due to its two-dimensional nature. Such a probe structure is therefore suited to carry carrier-envelope phase-dependent current components.

The graphene structure, the interface contact and the further interface contact may form a graphene heterostructure, like a symmetric graphene heterostructure.

The graphene structure may, for example, be placed on an insulating and/or transparent substrate, for example on a dielectric, such as silicon carbide (SiC). The graphene structure may be configured as a monolayer structure. The graphene structure may be epitaxially grown or exfoliated on the substrate.

According to an embodiment, the first and/or second light pulses are laser pulses. The laser pulses may, for example, be free-space laser pulses. This allows for efficient irradiation of the probe structure with the light pulses in a technically simple setup.

According to an embodiment, the sum current encodes a first output state of the logic output for the sum current being larger than a predetermined threshold current, and the sum current encodes a second output state of the logic output for the sum current being at most equal to the predetermined threshold current. This allows to discern the first and second output state in a technically simple way.

The measurement device may then be configured to generate, after having measured the sum current, the first output state of the logic output if the sum current is larger than the predetermined threshold current and to generate the second output state of the logic output if the sum current is at most equal to the predetermined threshold current.

The present disclosure is also directed at an optoelectronic system comprising the logic gate device according to the present disclosure and further comprising a first light source for generating the first light pulse and a second light source for generating the second light pulse, and a control device for controlling the first and second light source. Thereby, the control device is configured to control the first light source to generate the first carrier-envelope phase in dependence on the input state of the first logic input and to control the second light source to generate the second carrier-envelope phase in dependence on the input state of the second logic input.

The first and/or second light source may be, for example, laser sources. Thereby, the first and second light source may comprise separate lasers. Alternatively, the first and/or second light source may be provided by a single laser, whereby a laser beam of the single laser is split into two beams that each provide one of the first and second light sources. The separate lasers and the single laser may be, for example, titanium-sapphire lasers.

The present disclosure is also directed at an optoelectronic system comprising the logic gate device according to the present disclosure and further comprising a measurement device that is configured to measure the first and second current component at the interface contact and to derive the output state of the logic output from the sum current comprising the first and second current component.

The optoelectronic system may also comprise the first light source for generating the first light pulse, the second light source for generating the second light pulse, and the control device for controlling the first and second light source.

In a further aspect, the present disclosure is directed at a method for implementing a logic gate, the method comprising:

providing a first light pulse having a first carrier-envelope phase, the first carrier-envelope phase encoding an input state of a first logic input, providing a second light pulse having a second carrier-envelope phase, the second carrier-envelope phase encoding an input state of a second logic input, irradiating a probe structure with the first light pulse in a first interaction region to generate a first current component within the probe structure that depends on the first carrier-envelope phase, irradiating the probe structure with the second light pulse in a second interaction region to generate a second current component within the probe structure that depends on the second carrier-envelope phase, determining a sum current that comprises the first and second current component, wherein the sum current encodes a logic output state of a logic output of the logic gate device.

The method may be performed by using a logic gate device according to the present disclosure. Therefore, all embodiments and technical effects that are disclosed in connection with the logic gate device also apply to the method and vice versa.

The step of determining the sum current may be performed by the measurement device. Furthermore, the step of determining the sum current may comprise the steps of measuring the first and second current component at the interface contact, for example with the measurement device and deriving the output state of the logic output from the sum current comprising the first and second current component, for example with the measurement device.

Figure 2:
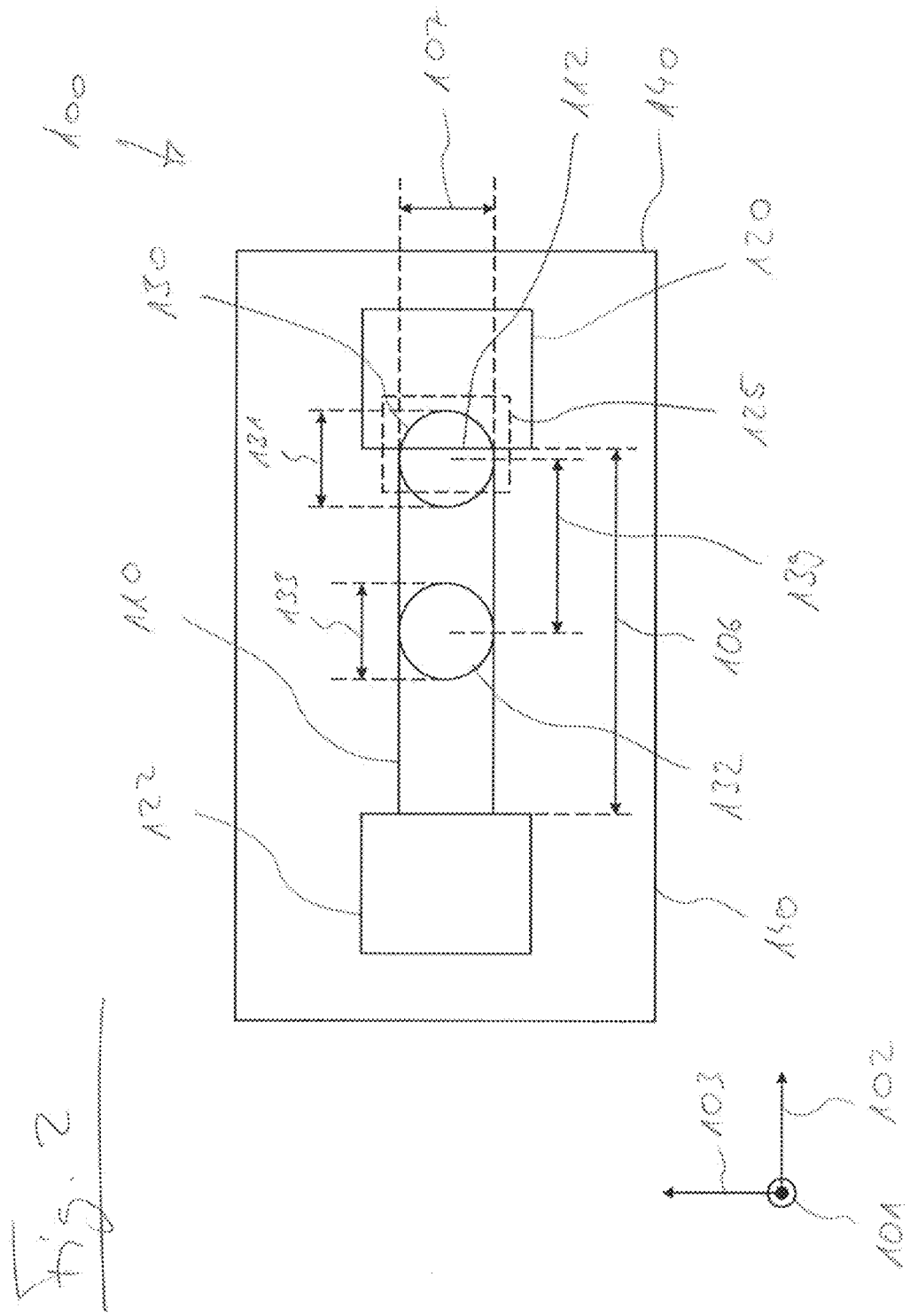
Figure 3:
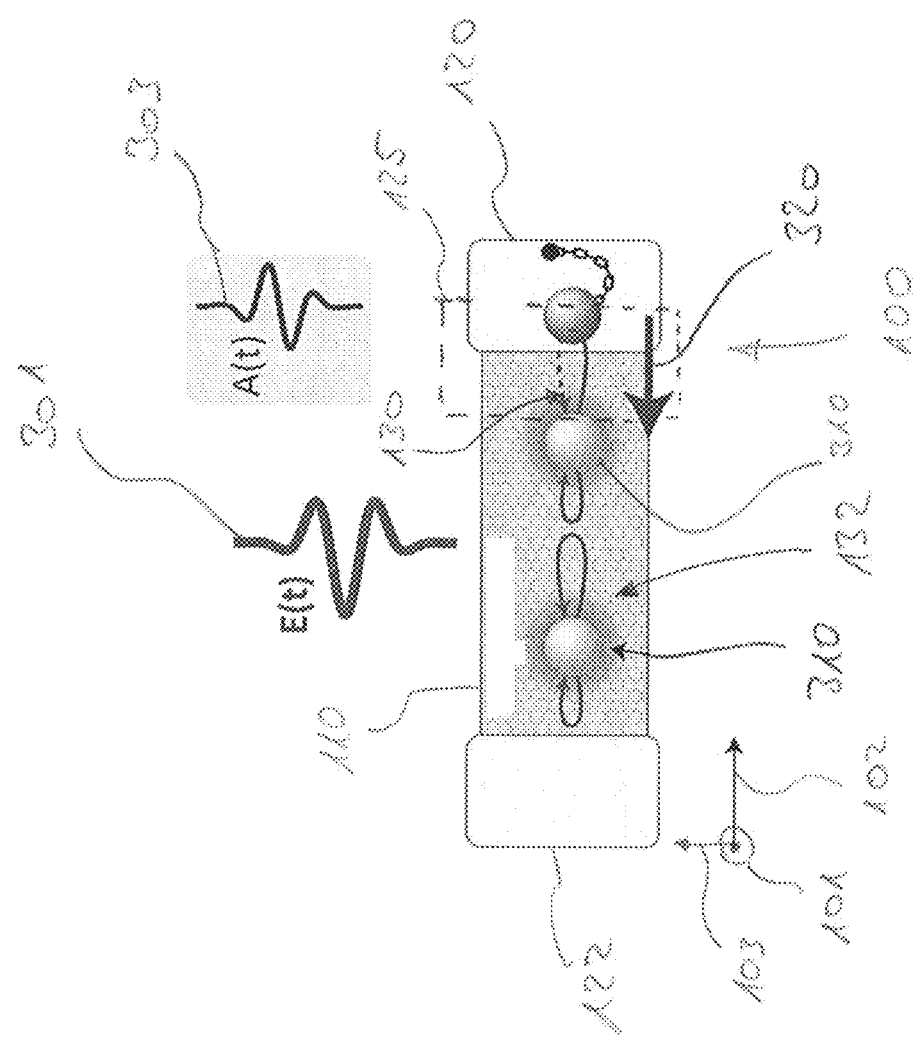
Figure 4:
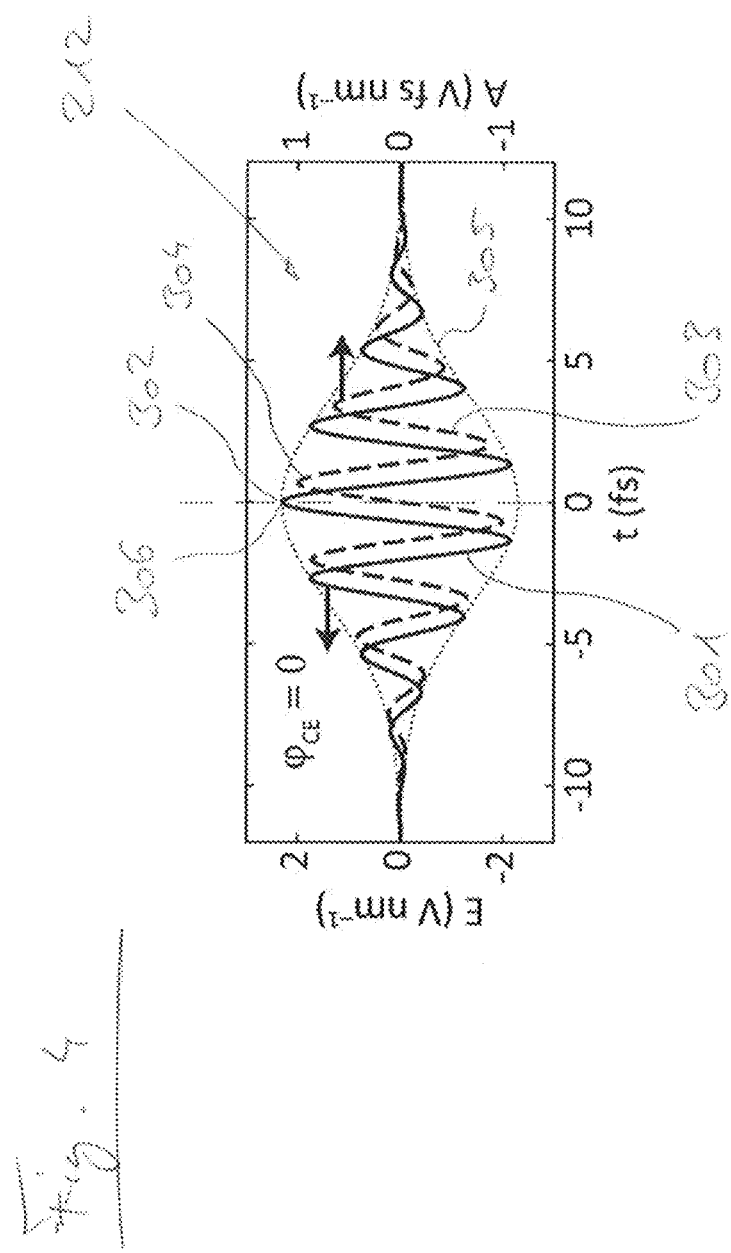
Figure 5:
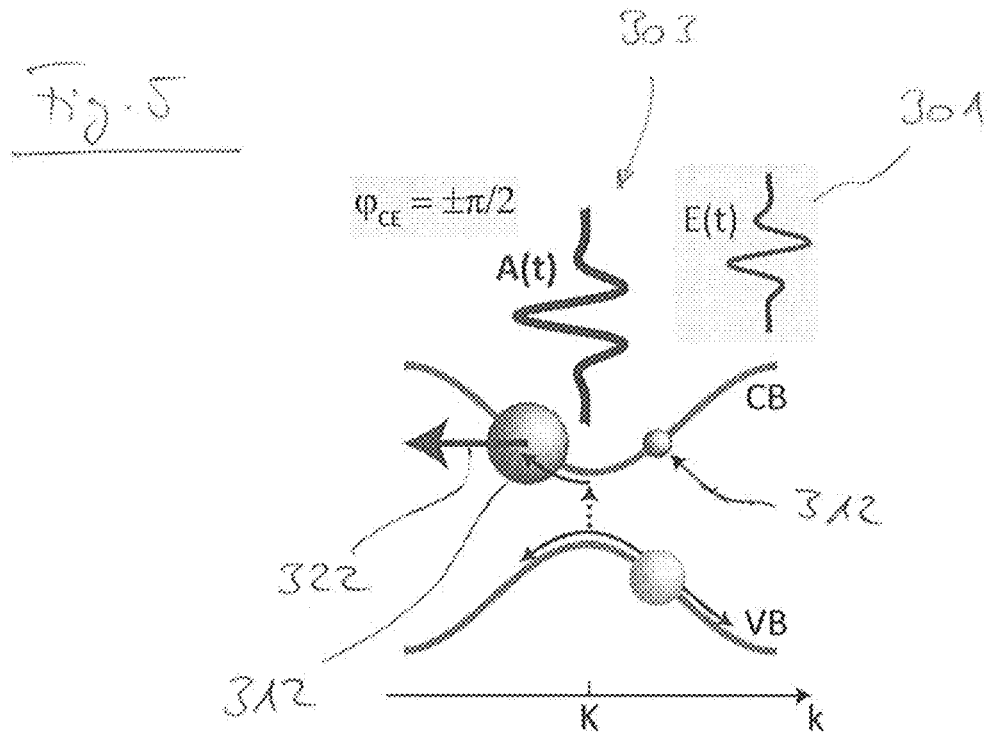
Figure 6:
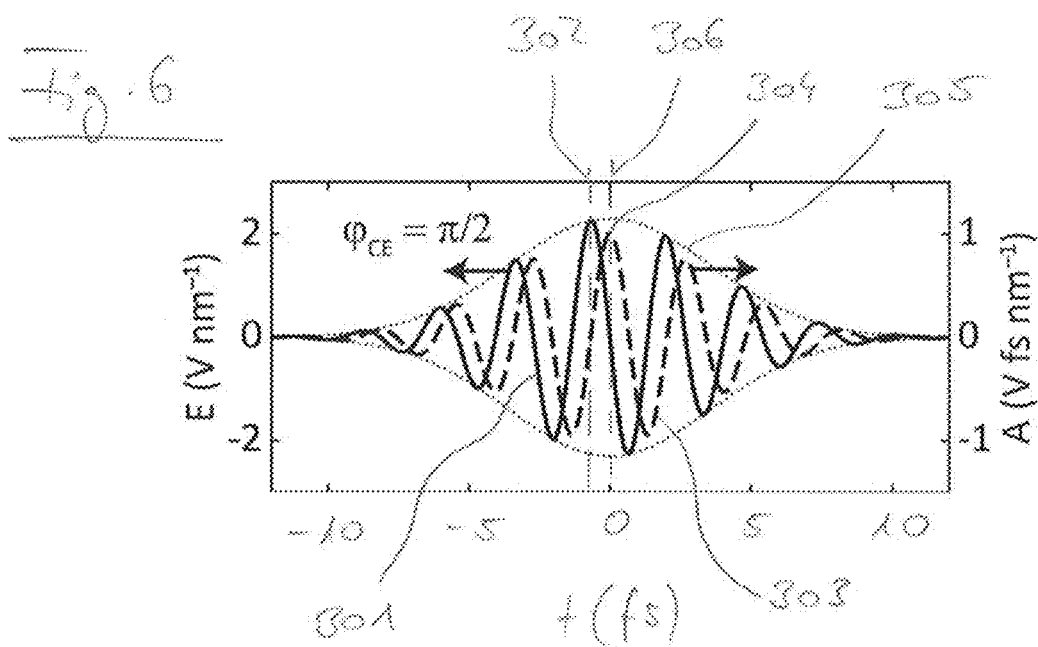
Figure 11:
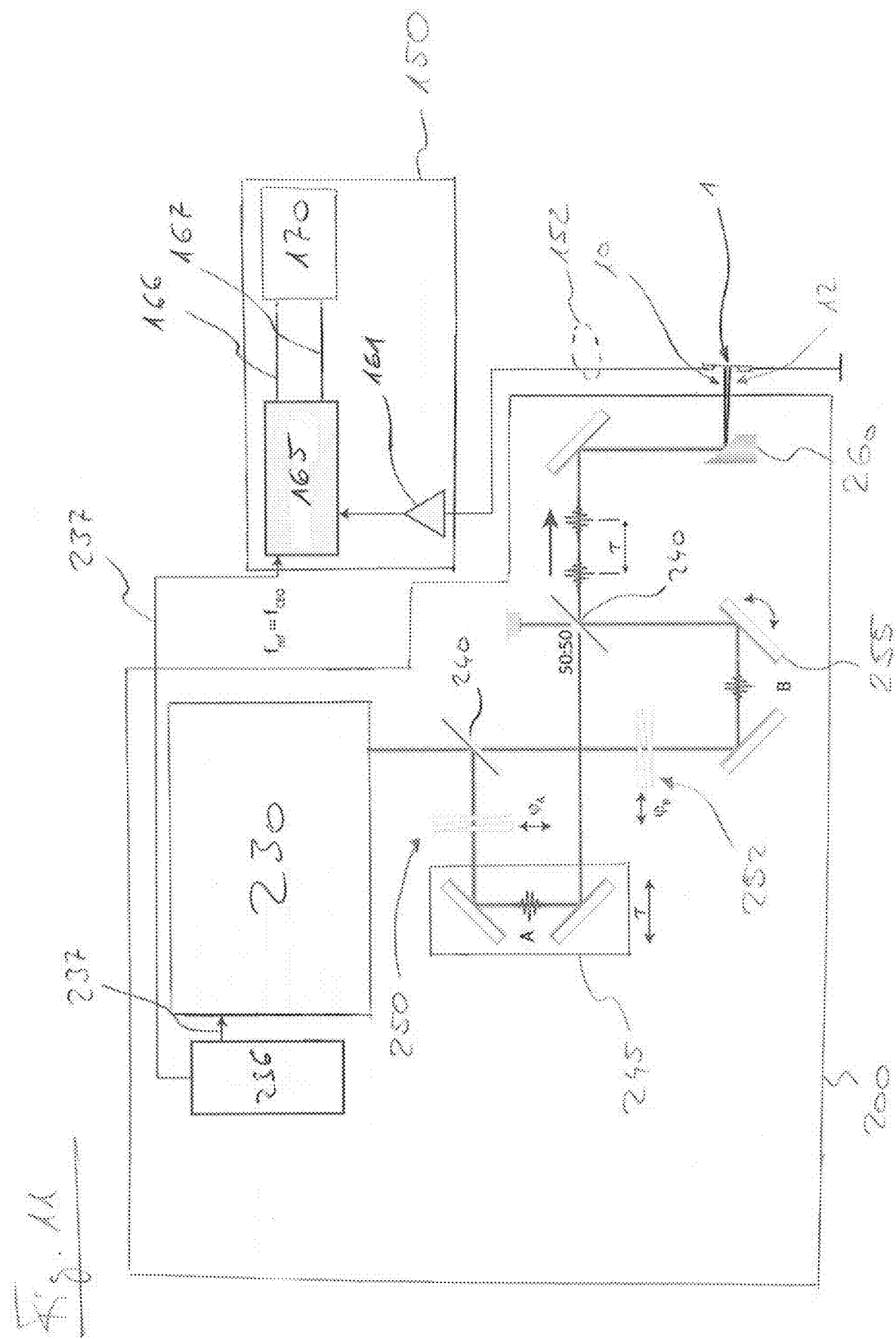
Figure 12:
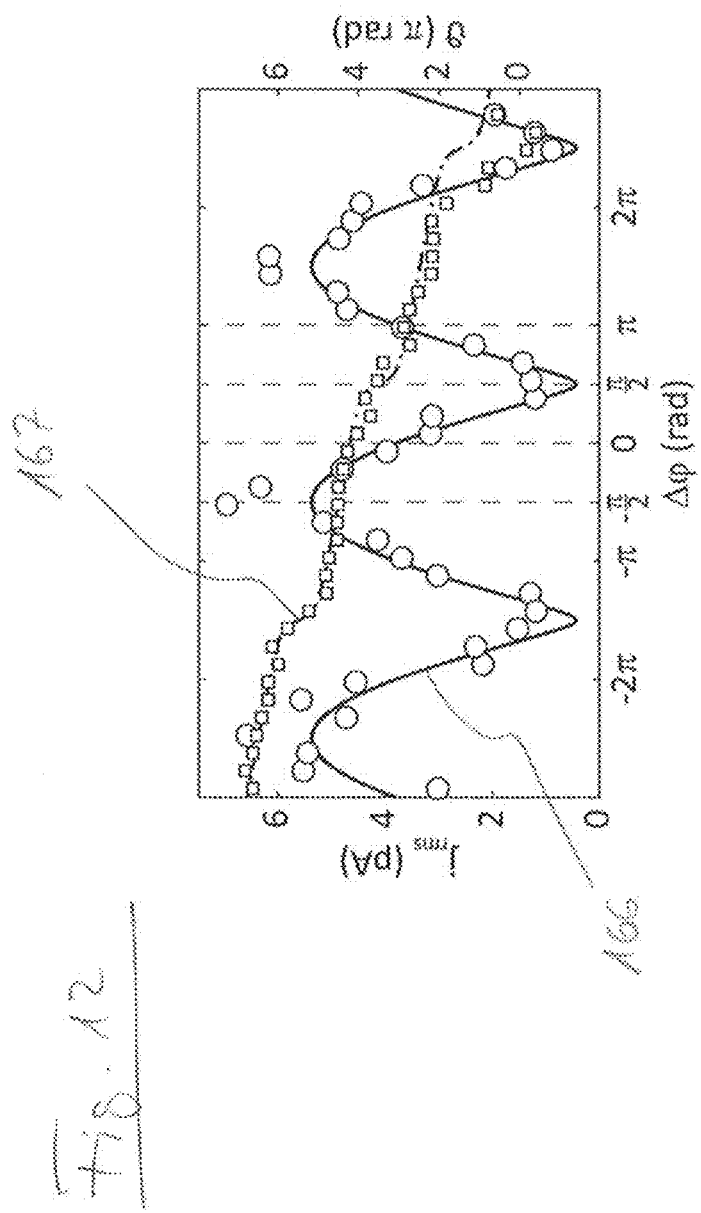
Figure 14:
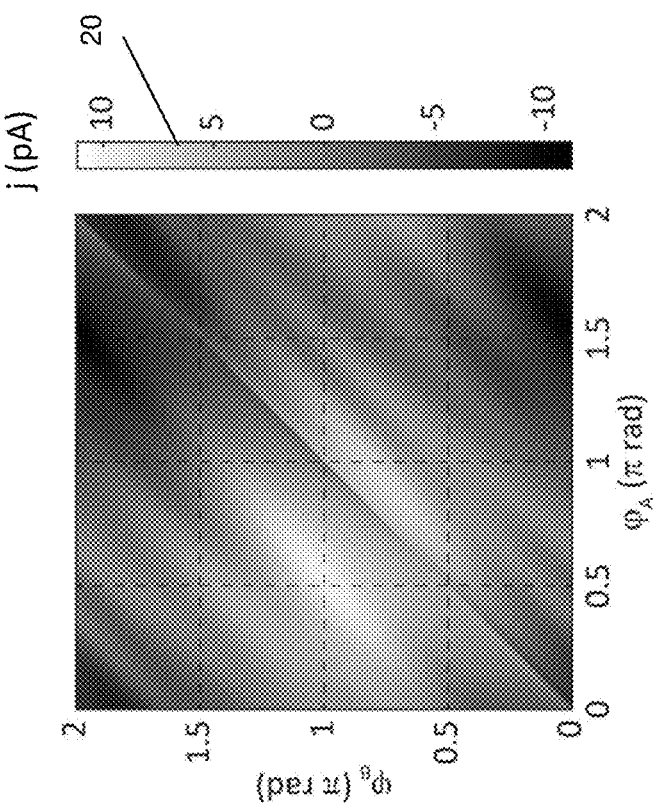
Figure 13:
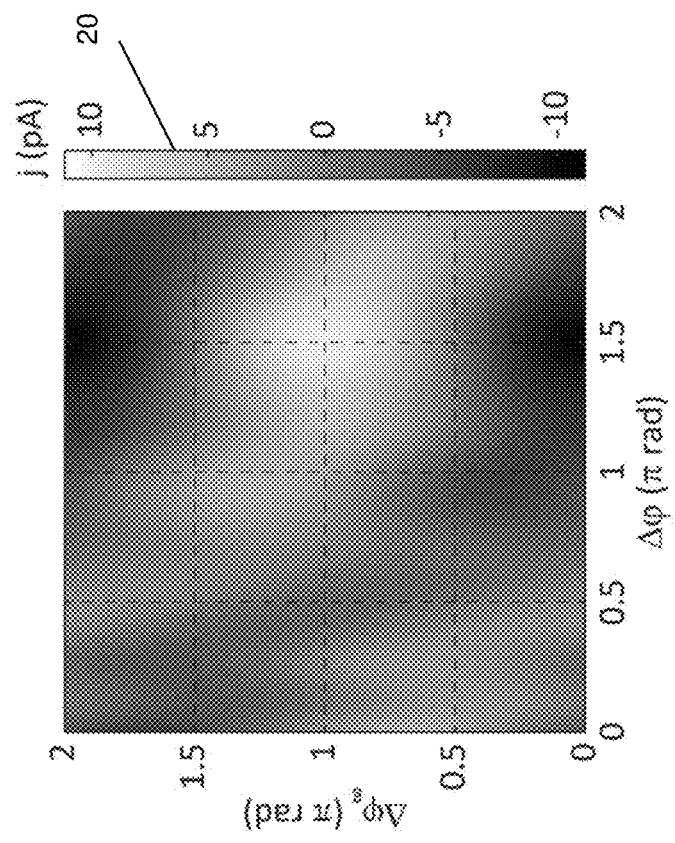
Figure 15:
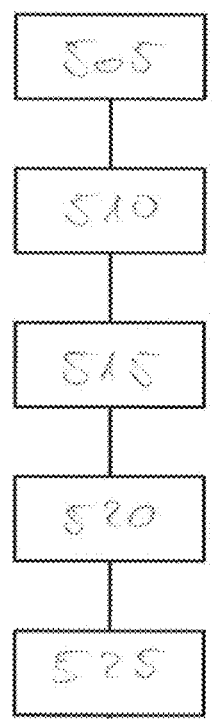

Exemplary embodiments and functions of the present disclosure are described herein in conjunction with the following drawings, showing schematically:

FIG. 1 a logic gate device according to the present disclosure;

FIG. 2 a top view of a probe structure of the logic gate device;

FIG. 3 excitation of virtual charge carriers:

FIG. 4 a vector potential and an electric field of a light pulse having a carrier-envelope phase of 0 rad;

FIG. 5 a band structure of the probe structure and excitation of real charge carriers:

FIG. 6 a vector potential and an electric field of a light pulse having a carrier-envelope phase of π/2 rad;

FIG. 7 carrier-envelope phase values, current components and output states for a NOR gate;

FIG. 8 carrier-envelope phase values, current components and output states for a NAND gate;

FIG. 9 carrier-envelope phase values, current components and output states for an OR gate;

FIG. 10 carrier-envelope phase values, current components and output states for an AND gate:

FIG. 11 an experimental setup to demonstrate formation of a first and second current component within the probe structure;

FIG. 12 measured values of amplitudes and phases of a sum current within the probe structure;

FIG. 13 a demodulated dependence of the sum current on a relative phase difference and a global phase shift of carrier-envelope phases of two light pulses;

FIG. 14 the sum current in dependence of a first carrier-envelope phase of a first light pulse and a second carrier-envelope phase of a second light pulse;

FIG. 15 a method for implementing a logic gate according to the present disclosure.

FIG. 1 depicts a logic gate device 1 according to the present disclosure. The logic gate device 1 comprises a probe device 100 having a probe structure 110 that is placed on a substrate 140. FIG. 2 depicts the probe device 100 in a top view parallel to a height direction 101.

The probe structure 110 is configured as a photoconductor and made from monolayer graphene that is epitaxially grown from the substrate 140, which is a 4H-Silicon Carbide (SiC) substrate. As can be seen from FIG. 2, the probe structure 110 has an extent 106 in a transverse direction 102 that is larger than an extent 107 in a further transverse direction 103, wherein the transverse direction 102 and the further transverse direction 103 are orientated perpendicular to each other and perpendicular to the height direction 101. Thereby, the extent 106 in the transverse direction 102 is 5 μm and the extent 107 in the further transverse direction 103 is 1.8 μm.

At a lateral side 110, which delimits the probe structure 110 in the transverse direction 102, the probe structure 110 is connected to a first interface contact 120, which is configured as a gold structure. The first interface contact 120 constitutes a logic output 152 of the logic gate device 1. A second interface contact 122, which is also a gold structure, is located at an opposite side of the probe structure 110 along the transverse direction 102. The first and second interface contact 120, 122 have a height of 30 nm in the height direction 101. As can be seen from FIG. 1, the first interface contact 120 is connected to a measurement device 150 and the second interface contact 122 is connected to ground.

A control device 200 comprises a first light source 210 and a second light source 220. The first light source 210 irradiates first light pulses 212 via a first logic input of the logic gate device 1 into a first interaction region 130 and the second light source 220 irradiates second light pulses 222 via a second logic input 12 of the logic gate device 1 into a second interaction region 132. As can be seen from FIG. 2, the first interaction region 130 is located in a boundary region 125 at the boundary between the first interface contact 120 and the probe structure 110. The second interaction region 132 is placed in a bulk region of the probe structure 110, which is separated from the boundary region 125.

The interaction regions 130, 132 are defined by the transverse dimensions of the light pulses 212, 222 in a plane spanned by the transverse directions 102, 103 at the probe structure 110. Thereby, the first interaction region 130 has a size 131 along the transverse direction 102 and the second interaction region 132 has a size 133 along the transverse direction 102, wherein each size 131, 133 amounts to 3.6 μm. A separation 139 between the first and second interaction region 130, 132 is 2.5 μm. Thereby, the sizes 131, 133 are given by the $1/e^2$ intensity radii of the light pulses 212, 222.

The first light pulses 212 encode input states of the first logic input 10 in their carrier-envelope phases and the second light pulses 222 encode input states of the second logic input 12 in their carrier-envelope phases. Exemplarily, the control device 200 is configured to receive the input states to be encoded in the carrier-envelope phases of the first light pulses 212 via a first control input 201 and to receive the input states to be encoded in the carrier-envelope phases of the second light pulses 222 via a second control input 202. The control device 200 then adjusts the carrier-envelope phases of the first light pulses 212 based on the input states received via the first control input 201 and the carrier-envelope phases of the second light pulses 222 based on the input states received via the second control input 202.

The first and second logic inputs 10, 12 are each configured as binary inputs and the corresponding input states may each assume a first input state, which corresponds to a logic 0, and a second input state, which corresponds to a logic 1. At least one of the two input states of the first logic input 10 are encoded in a carrier-envelope phase value of the first light pulse 212 that generates a non-zero current component within the first interaction region 130 of the probe structure 110. Likewise, at least one of the two input states of the second logic input 12 are encoded in a carrier-envelope phase value of the second light pulse 222 that generates a non-zero current component within the second interaction region 132 of the probe structure 110.

With the logic gate device 1, the non-zero current components within the first interaction region 130 are generated due to a net polarization of virtual charge carriers that are excited by first light pulses 212 that have a carrier-envelope phase of 0 rad or $\pi$ rad. The excitation of virtual charge carriers is schematically shown in FIG. 3, while FIG. 4 depicts the time evolution of a corresponding first light pulse 212 with a carrier-envelope phase value of 0 rad.

As can be seen from FIG. 4 for a carrier-envelope phase of 0 rad, the peak value 302 of the electric field 301 (also denoted E in FIG. 4) of the light pulse 212 coincides with the peak value of 306 of the pulse envelope 305. The corresponding vector potential 303 (also denoted A in FIG. 4) appears shifted by $\pi/2$ rad with respect to the electric field 301 so that the peak value 304 of the vector potential 303 is also shifted by $\pi/2$ rad with respect to the peak value 306 of the pulse envelope 305.

As can also be seen from FIG. 4, the electric field 301 has different magnitudes for positive and negative field amplitudes. Since virtual charge carriers 310 within the probe structure 110 directly follow the instantaneous electric field 301, the different magnitudes for positive and negative field amplitudes impart a net polarization 320 on the transiently deflected charge carriers 310, as it is schematically illustrated in FIG. 3. Thereby, the net polarization 320 within the first interaction region 130, which is located in the boundary region 125 between the probe structure 110 and the first interface contact 120, is probed by the interaction structure 120, which functions as a symmetry breaking structure that captures the transiently deflected virtual charge carriers 310.

The captured virtual charge carriers 310 then lead to a non-zero current component that is established between the first interface contact 120 and the second interface contact 122. The direction or sign of this current component with respect to the transverse direction 102 depends on the orientation of the peak value 302 of the electric field 301 with respect to the transverse direction 102, whereby the current component is reversed when switching the carrier-envelope phase between 0 rad and $\pi$ rad.

The second interaction region 132 is separated from the boundary region 125 of the first interface contact 120 and also from any other symmetry breaking structure, such as a comparable boundary region around the second interface contact 122. The second interaction region 132 is centered in between the interface contacts 120, 122. This suppresses spatial symmetry breaking. While the second light pulse 222 also excites a polarization response within the second interaction region 132, this polarization response is not probed by the interface contacts 120, 122. Therefore, carrier-envelope phase values of 0 rad or r rad of the second light pulse 222 do not generate any measurable non-zero current component within the probe structure 110.

The non-zero current components within the second interaction structure 132 are generated by the second light pulses 222 by imparting a net momentum onto real charge carriers within the probe structure 110 with second light pulses 222 that have carrier-envelope phases of $\pm\pi/2$ rad.

FIG. 5 depicts the band structure of the probe structure in momentum (k) space with the valence band VC and the conduction band CB, wherein k denotes the component of the momentum that is parallel to the transverse direction 102. Charge carriers 312 are excited from the valence band VC to the conduction band CB by interaction with the second light pulse 222, for example, by multiphoton absorption or Landau-Zener tunneling.

The charge carriers 312 generate a non-zero current component within the probe structure 110 if the second light pulse 222 imprints a net momentum 322 parallel to the transverse direction 102 on them by generating an asymmetric population of the conduction band CB with respect to the direction of the momentum component k. Asymmetry and thus also the imparted current is maximized for a vector potential 303 of the second light pulse 222 that has the largest difference in magnitude for positive and negative amplitudes. This is the case for light pulses 212, 222 that have an electric field 301 with a carrier-envelope phase of $\pm\pi/2$ rad. Since the asymmetric population of the conduction band CB with the charge carriers 312 represents a momentum of the charge carriers 312 that persists after passage of the laser pulses 222, the charge carriers 312 represent real charge carriers.

FIG. 6 depicts the vector potential 303 and the electric field 301 of a light pulse having a carrier-envelope phase of $\pi/2$ rad. The maximum amplitude 304 of the vector potential 303 coincides with the peak 306 of the pulse envelope 305, while a maximum amplitude 302 of the electric field 301 appears shifted by $\pi/2$ rad with respect to the peak 306 of the envelope 305.

As can also be seen from FIG. 6, the electric field 301 is anti-symmetric with respect to the peak 306 of the pulse envelope 305 and thus exhibits equal amplitudes in the negative and positive electric field direction. Light pulses 212, 222 having a carrier-envelope phase of $\pm\pi/2$ rad therefore do not generate a net polarization 320 of charge carriers within the probe structure 110. Likewise, as can exemplarily be seen from FIG. 4, the vector potential 303 of light pulses 212, 222 with a carrier-envelope phase of 0 rad or $\pi$ rad is anti-symmetric with respect to the peak 306 of the pulse envelope 305, so that these light pulses 212, 222 do not generate a net momentum 322 of charge carriers 312 within the probe structure 110.

In summary, maximum values of the first current component are generated for carrier-envelope phase values of the first light pulses 212 that are shifted by $\pi/2$ rad from carrier-envelope phase values for which the second light pulses 222 generate maximum values of the second current component. Furthermore, the maximum values of the first current component are generated for carrier-envelope phase values of the first light pulses 212 for which the second light pulses 222 only generate a zero current within the second interaction region 132 and vice versa.

In an exemplary embodiment of the logic gate device 1, the input values of the first logic input 10 and the input values of the second logic input 12 are encoded in carrier-envelope phase values of the first and second light pulses 212, 222 that realize a NOR gate. FIG. 7 depicts the corresponding carrier-envelope phase values, first and second current components and resulting output states of the logic output 152.

A first input state of the first logic input 10 corresponding to a logic 0 is encoded in a carrier-envelope phase of the first light pulse 212 of $\varphi_A=+\pi/2$ rad and a second input state of the first logic input 10 corresponding to a logic 1 is encoded in a carrier-envelope phase of the first light pulse 212 of $\varphi_A=0$ rad. Furthermore, a first input state of the second logic input 12 corresponding to a logic 0 is encoded in a carrier-envelope phase of the second light pulse 222 of $\varphi_B=+\pi/2$ rad and a second input state of the second logic input 12 corresponding to a logic 1 is encoded in a carrier-envelope phase of the second light pulse 222 of $\varphi_B=-\pi/2$ rad.

The carrier-envelope phase $\varphi_A=+\pi/2$ rad of the first input state of the first logic input 10 generates, within the first interaction region 130, a first current component 21 that is zero, which is depicted as a circle in a schematic sketch of the probe structure 110 in FIG. 7. The carrier-envelope phase $\varphi_A=0$ rad of the second input state of the first logic input 10 generates a first current component 21 within the first interaction region 130, which has a maximum current value and points away from the first interface contact 120. This is depicted as a left-pointing arrow in the schematic sketch of the probe structure 110 in FIG. 7. The carrier-envelope phase $\varphi_B=+\pi/2$ rad of the first input state of the second logic input 12 generates a second current component 22 within the second interaction region 132, which has a maximum current value and points towards the first interface contact 120. This is depicted as a right-pointing arrow in FIG. 7. Finally, the carrier-envelope phase $\varphi_B=-\pi/2$ rad of the second input state of the second logic input 12 generates a second current component 22 within the second interaction region 132, which has a maximum current value and points away from the first interface contact 120. This is depicted as a left-pointing arrow in FIG. 7.

With the logic gate device 1, a positive current direction of a sum current within the probe structure 110 is defined parallel to the transverse direction 102. A positive sum current 20 flowing from the probe structure 110 into the first interface contact 120 that exceeds a predetermined threshold current of +2 pA encodes a logic 1 and a sum current that does not exceed the predetermined threshold current encodes a logic 0.

As it is indicated in FIG. 7, if the carrier-envelope phase $\varphi_A=+\pi/2$ rad of the first light pulse 212 encodes the first input state of the first logic input 10 that corresponds to a logic 0 and if the carrier-envelope phase $\varphi_B=+\pi/2$ rad of the second light pulse 222 encodes the first input state of the second logic input 12 that corresponds to a logic 0, the first current component 21 and the second current component 22 add up to a sum current 20 that is larger than +2 pA and that thus encodes a logic 1. If the carrier-envelope phase $\varphi_A=0$ rad of the first light pulse 212 encodes the second input state of the first logic input 10 that corresponds to a logic 1 and the carrier-envelope phase $\varphi_B=+\pi/2$ rad of the second light pulse 222 encodes the first input state of the second logic input 12 that corresponds to a logic 0, the first current component 21 and the second current component 22 cancel each other and thus generate a sum current 20 that is smaller than +2 pA and that thus encodes a logic 0.

If the carrier-envelope phase $\varphi_A=+\pi/2$ rad encoding the first input state of the first logic input 10 corresponds to a logic 0 and the carrier-envelope phase $\varphi_B=-\pi/2$ rad encoding the second input state of the second logic input 12 corresponds to a logic 1, the first current component 21 and the second current component 22 add up to a sum current 20 that is negative and thus smaller than +2 pA and that thus encodes a logic 0. Finally, if the carrier-envelope phase $\varphi_A=0$ rad encoding the second input state of the first logic input 10 corresponds to a logic 1 and the carrier-envelope phase $\varphi_B=-\pi/2$ rad encoding the second input state of the second logic input 12 also corresponds to a logic 1, the first current component 21 and the second current component 22 add up to a sum current 20 that is negative and thus smaller than +2 pA and that thus encodes a logic 0.

With another embodiment of the logic gate device 1, the input values of the first logic input 10 and the input values of the second logic input 12 are encoded in carrier-envelope phase values of the first and second light pulses 212, 222 that realize a NAND gate. FIG. 8 depicts the corresponding carrier-envelope phase values $\varphi_A$, $\varphi_B$, first and second current components 21, 22 and resulting output states of the logic output 152.

The first input state of the first logic input 10, which first input state corresponds to a logic 0, is encoded in a carrier-envelope phase of $\varphi_A=\pi$ rad that generates a first current component 21 having maximum amplitude and being directed from the probe structure 110 into the first interface contact 120. The second input state of the first logic input 10, which second input state corresponds to a logic 1, is encoded in a carrier-envelope phase of $\varphi_A=-\pi/2$ rad that generates a zero current as first current component 21. The first input state of the second logic input 12, which first input state corresponds to a logic 0, is encoded in a carrier-envelope phase of $\varphi_B=+\pi/2$ rad that generates a second current component 22 having maximum amplitude and being directed from the probe structure 110 into the first interface contact 120. The second input state of the second logic input 12, which second input state corresponds to a logic 1, is encoded in a carrier-envelope phase of $\varphi_B=0$ rad that generates a zero current as second current component 22.

As long as at most one of the input states of the first and second logic input 10, 12 corresponds to a logic 0, the respective carrier-envelope phases $\varphi_A$, $\varphi_B$ of the first and second light pulses 212, 222 generate a current component 21, 22 that is directed towards the first interface contact 120. The sum current 20 then exceeds a current of +2 pA, corresponding to an output state of the logic output 152 that is a logic 1. If both input states of the first and second logic input 10, 12 correspond to a logic 1, both the first and second current component 21, 22 are a zero current. The sum current 20 is then below the predetermined threshold of +2 pA, corresponding to a logic 0.

In another embodiment of the logic gate device 1, the input values of the first logic input 10 and the input values of the second logic input 12 are encoded in carrier-envelope phase values $\varphi_A$, $\varphi_B$ of the first and second light pulses 212, 222 that realize an OR gate. FIG. 9 depicts the corresponding carrier-envelope phase values $\varphi_A$, $\varphi_B$, first and second current components 21, 22 and resulting output states of the logic output 152.

The first input state of the first logic input 10 (corresponding to a logic 0) is encoded in a carrier-envelope phase of $\varphi_A=+\pi/2$ rad that generates the first current component 21 as zero current. The second input state of the first logic input 10 (corresponding to a logic 1) is encoded in a carrier-envelope phase of $\varphi_A=\pi$ rad that generates the first current component 21 having maximum amplitude and being directed from the probe structure 110 into the first interface contact 120. The first input state of the second logic input 12 (corresponding to a logic 0) is encoded in a carrier-envelope phase of $\varphi_B=0$ rad that generates the second current component 22 as zero current. The second input state of the second logic input 12 (corresponding to a logic 1) is encoded in a carrier-envelope phase of $\varphi_B=+\pi/2$ rad that generates the second current component 22 having maximum amplitude and being directed from the probe structure 110 into the first interface contact 120.

If both input states of the first and second logic input 10, 12 correspond to a logic 0, the associated carrier-envelope phases $\varphi_A$, $\varphi_B$ of the first and second light pulses 212, 222 generate first and second current components 21, 22 that are zero. The sum current 20, which is also zero, and the output state of the logic output 152 corresponds to a logic 0. For all other combinations of input states, at least one of the carrier-envelope phase values $\varphi_A$, $\varphi_B$ of the first and second light pulses 212, 222 are adjusted to generate a first or second current component 21, 22 that has maximum amplitude and is directed from the probe structure 110 into the first interface contact 120. The corresponding sum current 20 then exceeds the threshold of +2 pA, thus encoding a logic 1 at the logic output 152.

FIG. 10 depicts carrier-envelope phase values, first and second current components and resulting output states of the logic output 152 for an embodiment of the logic gate device 1, in which the input values of the first logic input 10 and the input values of the second logic input 12 are encoded in carrier-envelope phase values $\varphi_A$, $\varphi_B$ of the first and second light pulses 212, 222 that realize an AND gate. The first input state of the first logic input 10 (corresponding to a logic 0) is encoded in a carrier-envelope phase of $\varphi_A=0$ rad that generates the first current component 21 having maximum amplitude and being directed away from the first interface contact 120 into the probe structure 110. The second input state of the first logic input 10 (corresponding to a logic 1) is encoded in a carrier-envelope phase of $\varphi_A=\pi$ rad that generates the first current component 21 having maximum amplitude and being directed from the probe structure 110 into the first interface contact 120. The first input state of the second logic input 12 (corresponding to a logic 0) is encoded in a carrier-envelope phase of $\varphi_B=-\pi/2$ rad that generates the second current component 22 having maximum amplitude and being directed away from the first interface contact 120 into the probe structure 110. The second input state of the second logic input 12 (corresponding to a logic 1) is encoded in a carrier-envelope phase of $\varphi_B=+\pi/2$ rad that generates the second current component 22 having maximum amplitude and being directed from the probe structure 110 into the first interface contact 120.

If both input states of the first and second logic input 10, 12 correspond to a logic 0, the associated carrier-envelope phase values $\varphi_A$, $\varphi_B$ of the first and second light pulses 212, 220 generate first and second current components 21, 22 that are directed away from the first interface contact 120 and have maximum amplitude. The corresponding sum current 20 then is below the predetermined threshold of +2 pA and the output state of the logic output 152 corresponds to a logic 0. If one of the input states of the first and second logic input 10, 12 corresponds to a logic 0 and the other one of the input states corresponds to a logic 1, the associated carrier-envelope phase values $\varphi_A$, $\varphi_B$ of the first and second light pulses 212, 220 generate first and second current components 21, 22 that have maximum amplitudes and opposite directions. Therefore, the first and second current components 21, 22 cancel each other and the sum current 20 is below the predetermined threshold of +2 pA. The output state of the logic output 152 then corresponds to a logic 0. If both input states of the first and second logic input 10, 12 correspond to a logic 1, the associated carrier-envelope phases $\varphi_A$, $\varphi_B$ of the first and second light pulses 212, 222 generate first and second current components 21, 22 that have maximum amplitude and are directed from the probe structure 110 into the first interface contact 120. The corresponding sum current 20 then exceeds the predetermined threshold of +2 pA and the output state of the logic output 152 corresponds to a logic 1.

FIG. 11 depicts an experimental setup to demonstrate formation of the first and second current component 21, 22 within the probe structure, as well as formation of the sum currents 20 within the probe structure 110 that represent the output states of the logic operations shown in FIGS. 7 to 10.

A control device 200 comprises a laser source 230 that is configured to output carrier-envelope phase stabilized laser pulses from which the first and second light pulses 212, 222 are deduced. The laser pulses have a FWHM duration of 6 fs at a center wavelength of 800 nm and a repetition rate of 80 MHz. The laser source 230 has a laser, which is a titanium sapphire laser, that generates the laser pulses.

The laser pulses are fed to a further beam splitter 240 that equally splits the laser pulses in a first laser pulse propagating via a first interferometer arm A and a second laser pulse propagating via a second interferometer arm B. The first interferometer arm A comprises a first phase adjustment device 250 that is controllable to adjust the carrier-envelope phase $\varphi_A$ of the first laser pulse and the second interferometer arm B comprises a second phase adjustment device 252 that is controllable to adjust the carrier-envelope phase $\varphi_B$ of the second laser pulse. Each phase adjustment device 250, 252 is exemplarily configured as a pair of SiO2 wedges that are controllable to move laterally through the path of the first and second laser pulse and thereby vary the thickness of the glass material that is passed by the first and second laser pulses.

The interferometer arm A additionally comprises a pulse separation adjustment device 245 that is configured to adjust a temporal separation between the first and second laser pulse. Thereby, the first laser pulse is delayed by a temporal delay of 130 fs with respect to the second laser pulse. The interferometer arm B comprises a steering device 255 that is exemplarily configured as an adjustable mirror and that introduces an angle between the second laser pulse traveling through interferometer arm B and the first laser pulse traveling through interferometer arm A in the far field. In the near field, the second laser pulse is displaced with respect to the first laser pulse.

The first and second laser pulses are focused by a focusing device 260, which is exemplarily configured as an off-axis parabolic mirror that focuses both laser pulses, to the logic gate device 1. Due to the angle controlled by the steering device 255, the first laser pulse is focused as the first light pulse 212 to the first interaction region 130 and the second laser pulse is focused as the second light pulse 222 to the second interaction region 132. The beam path of the first laser pulse then constitutes the first logic input 10 and the beam path of the second laser pulse constitutes the second logic input 12. Both light pulses 212, 222 reach a peak field strength of 2.3 V/nm on the probe structure 110.

The first interface contact 120 of the probe structure 110 is connected to a measurement device 150 that comprises a transimpedance amplifier 161 and a lock-in amplifier 165. The second interface contact 122 is connected to ground. The lock-in amplifier 165 is furthermore connected to a signal generator 236 that is also connected to the laser source 230.

The measurement device 150 is configured to measure the sum current 20 by performing a dual-phase lock-in detection that is referenced to a periodic modulation of the carrier-envelope phase of the laser pulse generated by the laser source 230. Thereby, a modulation signal 237 of the signal generator 236 adjusts the carrier-envelope phase of the laser source 230, which is periodically modulated with a modulation frequency of f=3.3 kHz. The lock-in amplifier 165 receives this modulation signal 237 from the signal generator 236 and outputs a lock-in amplitude 166 and lock-in phase 167 of a periodic component of the sum current 20 at the frequency of the modulation signal 237. An evaluation device 170 of the measurement device 150 receives the lock-in amplitude 166 and the lock-in phase 167 and determines the direction and amplitude of the sum current 20 for specific values of the carrier-envelope phase $\varphi_A$ of the first light pulse 212 and the carrier-envelope phase $\varphi_B$ of the second light pulse 222.

FIG. 12 depicts the measured values of the lock-in amplitude 166 (circles) and the lock-in phase 167 (squares) of the sum current 20 in dependence on a relative phase difference $\Delta\varphi=\varphi_A-\varphi_B$ of the carrier-envelope phase $\varphi_A$ of the first light pulse 212 and the carrier-envelope phase $\varphi_B$ of the second light pulse 222 that is introduced by the phase adjustment devices 250, 252.

The evaluation device 170 is configured to determine the direction of the sum current 20 for the specific phase values of the first and second carrier-envelope phases $\varphi_A$, $\varphi_B$ used in the various logic gates depicted in FIGS. 7 to 10. The evaluation device 170 thereby demodulates the harmonic oscillation of the sum current 20 based on the lock-in phase 167 and amplitude 166 shown in FIG. 12 by assuming a sinusoidal variation of the sum current 20 according to $j(\Delta\varphi,\Delta\varphi_g)=\sqrt{2}\cdot j_{rms}(\Delta\varphi)\cdot\sin(\Delta\varphi_g-\vartheta(\Delta\varphi))$ with $\Delta\varphi_g=2\pi\cdot f\cdot t$ being a global phase shift due to the periodic variation of the carrier-envelope phase of the laser pulse output by the laser source 230 at frequency f and time t, $\vartheta(\Delta\varphi)$ the lock-in phase 167 and $j_{rms}(\Delta\varphi)$ the lock-in amplitude 166. The demodulated dependence of $j(\Delta\varphi,\Delta\varphi_g)$ on $\Delta\varphi$ and $\Delta\varphi_g$ is depicted in FIG. 13.

The evaluation device 170 is further configured to transform the demodulated dependence of $j(\Delta\varphi,\Delta\varphi_g)$ on $\Delta\varphi$ and $\Delta\varphi_g$ into a basis consisting of the carrier-envelope phase values $\varphi_A$ and $\varphi_B$ of the first and second light pulses 212, 222 according to $$\tilde{j}(\varphi_A,\varphi_B)=j(\Delta\varphi=(\varphi_A-\varphi_B)\bmod 2\pi,\Delta\varphi_g=\varphi_B).$$

FIG. 14 depicts the sum current 20 in this basis. As can be seen from the carrier-envelope phase values $\varphi_A$, $\varphi_B$ used for the NOR gate shown in FIG. 7, the sum current 20 exceeds the threshold value of j=+2 pA for $\varphi_A=\varphi_B=\pi/2$, while it is below this threshold value for the other phase combinations ($\varphi_A=0$; $\varphi_B=\pi/2$), ($\varphi_A=\pi/2$; $\varphi_B=3\pi/2$) (equivalent to ($\varphi_A=\pi/2$; $\varphi_B=-\pi/2$)) and ($\varphi_A=0$; $\varphi_B=3\pi/2$) (equivalent to ($\varphi_A=0$; $\varphi_B=-\pi/2$)).

Furthermore, for the carrier-envelope phase values VA, fs used for the NAND gate shown in FIG. 8, the sum current 20 exceeds the threshold value of j=+2 pA for phase combinations ($\varphi_A=\pi$; $\varphi_B=\pi/2$)·($\varphi_A=3\pi/2$; $\varphi_B=\pi/2$) (equivalent to ($\varphi_A=-\pi/2$; $\varphi_B=\pi/2$)) and ($\varphi_A=\pi$; $\varphi_B=0$), while it is below this threshold value for ($\varphi_A=3\pi/2$; $\varphi=0$) (equivalent to ($\varphi_A=-\pi/2$; $\varphi_B=0$)).

For the carrier-envelope phase values $\varphi_A$, $\varphi_B$ used for the OR gate shown in FIG. 9, the sum current 20 is below the threshold value of j=+2 pA for the phase combination ($\varphi_A=\pi/2$; $\varphi_B=0$), while it is above this threshold value for ($\varphi_A=\pi$; $\varphi_B=0$), ($\varphi_A=\pi/2$; $\varphi_B=\pi/2$) and ($\varphi_A=\pi$; $\varphi_B=\pi/2$).

Finally, for the carrier-envelope phase values $\varphi_A$, $\varphi_B$ used for the AND gate shown in FIG. 10, the sum current 20 is below the threshold value of j=+2 pA for the phase combinations ($\varphi_A=0$; $\varphi_B=3\pi/2$) (equivalent to ($\varphi_A=0$; $\varphi_B=-\pi/2$)), ($\varphi_A=\pi$; $\varphi_B=3\pi/2$) (equivalent to ($\varphi_A=\pi$; $\varphi_B=-\pi/2$) and ($\varphi_A=0$; $\varphi_B=\pi/2$), while it is above this threshold for the phase combination ($\varphi_A=\pi$; $\varphi_B=\pi/2$).

The results obtained from the experimental setup (FIG. 11) shown in FIGS. 13 and 14 thus unambiguously demonstrate that the sum current 20 is generated within the probe structure 110 and at the interface contact 122 and that the sum current produces logic output states that depend on the respective phase combinations $\varphi_A$, $\varphi_B$ of the carrier-envelope phases of the light pulses 112, 122 in a way that the logic gate device 1 implements the NOR gate when encoding the logic input states in the carrier-envelope phase values $\varphi_A$, $\varphi_B$ shown in FIG. 7, the NAND gate when encoding the logic input states in the carrier-envelope phase values $\varphi_A$, $\varphi_B$ shown in FIG. 8, the OR gate when encoding the logic input states in the carrier-envelope phase values $\varphi_A$, $\varphi_B$ shown in FIG. 9 and the AND gate when encoding the logic input states in the carrier-envelope phase values $\varphi_A$, $\varphi_B$ shown in FIG. 10.

FIG. 15 depicts a method 500 for implementing a logic gate according to the present disclosure. The method 500 comprises providing 505 the first light pulse 212 having the first carrier-envelope phase $\varphi_A$ and providing 510 the second light pulse 222 having the second carrier-envelope phase $\varphi_B$. The method 500 furthermore comprises irradiating 515 the probe structure with the first light pulse 212 in the first interaction region 130 and irradiating 520 the probe structure 110 with the second light pulse 222 in the second interaction region 132. Furthermore, the method comprises outputting 525 the sum current at the first interface contact 120.

REFERENCE NUMERAL LIST 1 logic gate device
10 first logic input
12 second logic input
20 sum current
21 first current component
22 second current component
100 probe device
101 height direction
102 transverse direction
103 further transverse direction
105 extent in height direction
106 extent in transverse direction
107 extent in further transverse direction
110 probe structure
112 lateral side
120 first interface contact
122 second interface contact
125 boundary region
130 first interaction region
131 size of first interaction region
132 second interaction region 133 size of second interaction region
139 separation
140 substrate
150 measurement device
152 logic output
161 transimpedance amplifier
165 lock-in amplifier
166 lock-in amplitude
167 lock-in phase
170 evaluation device
200 control device
201 first control input
202 second control input
210 first light source
212 first light pulse
214 first carrier-envelope phase
220 second light source
222 second light pulse
224 second carrier-envelope phase
230 laser source
236 signal generator
237 modulation signal
240 beam splitter
245 delay device
250 first phase adjustment device
252 second phase adjustment device
255 steering device
260 focusing device
301 electric field
302 maximum amplitude of the electric field
303 vector potential
304 maximum amplitude of the vector potential
305 envelope
306 peak of the envelope
310 virtual charge carriers
312 real charge carriers
320 net polarization
322 net momentum
500 method
505 providing first light pulse
510 providing second light pulse
515 irradiating with first light pulse
520 irradiating with second light pulse
525 output sum current
CB conduction band
VB valence band
k momentum

The invention claimed is:
1. A logic gate device comprising
a probe structure having an interface contact,
a first logic input for receiving a first light pulse having a first carrier-envelope phase $\varphi\_A$ that encodes an input state of the first logic input and a second logic input for receiving a second light pulse having a second carrier-envelope phase $\varphi\_B$ that encodes an input state of the second logic input,
wherein the probe structure is arranged to be irradiated by the first light pulse in a first interaction region to generate a first current component within the probe structure that depends on the first carrier-envelope phase $\varphi\_A$,
wherein the probe structure is arranged to be irradiated by the second light pulse in a second interaction region to generate a second current component within the probe structure that depends on the second carrier-envelope phase $\varphi\_B$,
wherein the interface contact is arranged to output a sum current that comprises the first and second current components, and
wherein the sum current encodes a logic output state of a logic output of the logic gate device.

2. The logic gate device according to claim 1, wherein the input state of the first logic input is encoded in a phase value of the first carrier-envelope phase $\varphi\_A$ that causes the first light pulse to generate the first current component due to a net polarization of virtual charge carriers within the probe structure.

3. The logic gate device according to claim 1, wherein the input state of the second logic input is encoded in a phase value of the second carrier-envelope phase $\varphi\_B$ that causes the second light pulse to generate the second current component due to a net momentum of real charge carriers within the probe structure.

4. The logic gate device according to claim 1, wherein the input state of the second logic input is encoded in a phase value of the second carrier-envelope phase $\varphi\_B$ that causes the second light pulse to generate the second current component due to a net polarization of virtual charge carriers within the probe structure.

5. The logic gate device according to claim 1, wherein the first interaction region is at least partly separate from the second interaction region.

6. The logic gate device according to claim 1, wherein the first interaction region encompasses a boundary region between the probe structure and the interface contact.

7. The logic gate device according to claim 1, wherein the second interaction region is separate from a boundary region between the probe structure and the interface contact.

8. The logic gate device according to claim 1, wherein:
the first current component is generated having a first lifetime that is smaller than a second lifetime of the second current component;
the probe structure is arranged to be irradiated with at least one additional first light pulse received via the first logic input during the second lifetime;
the additional first light pulse generates an additional first current component within the probe structure;
the interface contact is arranged to output an additional sum current that comprises the additional first current component and the second current component; and
the additional sum current encodes an additional logic output state of the logic output of the logic gate device.

9. The logic gate device according to claim 1, wherein:
the probe structure has a smaller extent in a height direction than in a transverse direction, the height direction being orientated perpendicular to the transverse direction; and
the interface contact is positioned at a lateral side of the probe structure, the lateral side limiting the probe structure in the transverse direction.

10. The logic gate device according to claim 9, wherein the first interaction region and the second interaction region are located next to each other in the transverse direction.

11. The logic gate device according to claim 1, wherein the probe structure comprises a material having a conduction and a valence band.

12. The logic gate device according to claim 11, wherein the probe structure is a graphene structure.

13. The logic gate device according to claim 1, wherein the first and/or second light pulses are laser pulses.

14. The logic gate device according to claim 1, wherein the first and/or second light pulses are free-space laser pulses.

15. The logic gate device according to claim 1, wherein:
the sum current encodes a first output state of the logic output for the sum current being larger than a predetermined threshold current; and
the sum current encodes a second output state of the logic output for the sum current being at most equal to a predetermined threshold current.

16. Optoelectronic system comprising a logic gate device, the logic gate device comprising
a probe structure having an interface contact; and
a first logic input for receiving a first light pulse having a first carrier-envelope phase $\varphi\_A$ that encodes an input state of the first logic input and a second logic input for receiving a second light pulse having a second carrier-envelope phase $\varphi\_B$ that encodes an input state of the second logic input,
wherein the probe structure is arranged to be irradiated by the first light pulse in a first interaction region to generate a first current component within the probe structure that depends on the first carrier-envelope phase $\varphi\_A$,
wherein the probe structure is arranged to be irradiated by the second light pulse in a second interaction region to generate a second current component within the probe structure that depends on the second carrier-envelope phase $\varphi\_B$,
wherein the interface contact is arranged to output a sum current that comprises the first and second current components,
wherein the sum current encodes a logic output state of a logic output of the logic gate device, the optoelectronic system further comprising
a first light source for generating the first light pulse and a second light source for generating the second light pulse, and
a control device for controlling the first and second light source, and wherein the control device is configured to control the first light source to generate the first carrier-envelope phase $\varphi\_A$ in dependence on the input state of the first logic input and to control the second light source to generate the second carrier-envelope phase $\varphi\_B$ in dependence on the input state of the second logic input.

17. Method for implementing a logic gate, the method comprising:
providing a first light pulse having a first carrier-envelope phase at a first logic input of a logic gate device, the first carrier-envelope phase encoding an input state of the first logic input;
providing a second light pulse having a second carrier-envelope phase at a second logic input of the logic gate device, the second carrier-envelope phase encoding an input state of the second logic input;
irradiating a probe structure of the logic gate device with the first light pulse in a first interaction region to generate a first current component within the probe structure that depends on the first carrier-envelope phase;
irradiating the probe structure with the second light pulse in a second interaction region to generate a second current component within the probe structure that depends on the second carrier-envelope phase; and
outputting a sum current via an interface contact of the probe structure, the sum current comprising the first and second current components, wherein the sum current encodes a logic output state of a logic output of the logic gate device.

* * * * *